(12) United States Patent
Kim et al.

(10) Patent No.: US 12,111,879 B2
(45) Date of Patent: Oct. 8, 2024

(54) DISTRIBUTION OUTPUT DEVICE AND OPERATING METHOD

(71) Applicant: SAMSUNG ELECTRONICS CO., LTD., Suwon-si (KR)

(72) Inventors: Hakgyun Kim, Suwon-si (KR); Bumsuk Chung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 146 days.

(21) Appl. No.: 17/366,180

(22) Filed: Jul. 2, 2021

(65) Prior Publication Data

US 2022/0216115 A1    Jul. 7, 2022

(30) Foreign Application Priority Data

Jan. 6, 2021 (KR) .................. 10-2021-0001277

(51) Int. Cl.
  *G06F 17/18*    (2006.01)
  *G06F 17/15*    (2006.01)
  *H01L 21/66*    (2006.01)

(52) U.S. Cl.
  CPC ............. *G06F 17/18* (2013.01); *G06F 17/15* (2013.01); *H01L 22/12* (2013.01); *H01L 22/20* (2013.01)

(58) Field of Classification Search
  CPC ..................................................... G06F 17/18
  See application file for complete search history.

(56) References Cited

U.S. PATENT DOCUMENTS

| | | |
|---|---|---|
| 6,876,445 B2 | 4/2005 | Shibuya et al. |
| 7,586,599 B2 | 9/2009 | Goren |
| 7,660,686 B1 | 2/2010 | Nicolaides et al. |
| 8,560,244 B2 | 10/2013 | Neumann et al. |
| 9,922,269 B2 | 3/2018 | Venkataraman et al. |
| 2019/0212384 A1 | 7/2019 | Saito |
| 2020/0192737 A1* | 6/2020 | Kind .................. G06F 11/0766 |

FOREIGN PATENT DOCUMENTS

CN   101311738 A  * 11/2008
CN   105528742 A  *  4/2016
(Continued)

OTHER PUBLICATIONS

Haan, "A Simple Classification Approach to Build a Bathtub" 2008 IEEE (Year: 2008).*

(Continued)

*Primary Examiner* — John C Kuan
(74) *Attorney, Agent, or Firm* — Fish & Richardson P.C.

(57) ABSTRACT

An operating method for a distribution output device includes; generating data number sets for data groups, grouping defect times according to an order in which the corresponding defects occurred in relation to each of the data number sets, calculating likelihood summations respectively corresponding to the data number sets in relation to defect times grouped in accordance with the data number sets, determining a maximum likelihood summation among the likelihood summations, determining optimal population parameter data for each of the data groups in relation to the maximum likelihood summation, and outputting a Weibull distribution for each of the data groups in relation to the optimal population parameter data for each of the data groups.

20 Claims, 9 Drawing Sheets

(56) References Cited

FOREIGN PATENT DOCUMENTS

KR      20100075292 A   *   7/2010
KR         101959619        7/2019

OTHER PUBLICATIONS

Tarum, "Classification and Analysis of Weibull Mixtures" 1999 SAE (Year: 1999).*
Hung et al., "Fuzzy classification maximum likelihood algorithms for mixed-Weibull distributions" Springer-Verlag 2007 (Year: 2007).*
Machine translation for CN-101311738-A, downloaded Jun. 2023 (Year: 2023).*
Ohring, "Chapter 15 Failure and Reliability of Electronic Materials and Devices" Engineering Materials Science, 1995 (Year: 1995).*
Elmahdy et al., A new approach for parameter estimation of finite Weibull mixture distributions for reliability modeling, Applied Mathematical Modelling.
Stochastic EM algorithms for parametric and semiparametric mixture models for right-censored lifetime data, Laurent Bordes, Didier Chauveau.

* cited by examiner

FIG. 8

| ITERATION | NUMBER OF DATA BY GROUP | | | LIKELIHOOD SUM |
|---|---|---|---|---|
| | GROUP 1 | GROUP 2 | GROUP 3 | |
| 1st | 2 | 55 | – | −387 |
| 2nd | 3 | 54 | – | −381 |
| 3rd | 4 | 53 | – | −385 |
| ⋮ | ⋮ | ⋮ | ⋮ | ⋮ |
| 21th | 55 | 2 | – | −399 |
| 22th | – | 55 | 2 | −400 |
| ⋮ | ⋮ | ⋮ | ⋮ | ⋮ |
| 51th | – | 2 | 55 | −389 |
| 52th | 3 | 46 | 8 | −387 |
| 53th | 3 | 45 | 9 | −379 |
| 54th | 2 | 45 | 10 | −391 |
| ⋮ | ⋮ | ⋮ | ⋮ | ⋮ |

DISTRIBUTION OUTPUT DEVICE AND OPERATING METHOD

CROSS-REFERENCE TO RELATED APPLICATION

This application claims priority under 35 U.S.C. § 119 to Korean Patent Application No. 10-2021-0001277 filed on Jan. 6, 2021 in the Korean Intellectual Property Office, the subject matter of which is hereby incorporated by reference.

BACKGROUND

The inventive concept relates to devices and operating methods capable of providing a distribution of data for various defects identified in a semiconductor wafer. More particularly, the inventive concept relates to devices and operating methods capable of providing a distribution of data for defects and/or defect times for each defect characteristic associated with a wafer.

Time-dependent dielectric breakdown (TDDB) is a type of transistor aging—a failure mechanism associated with metal-oxide-semiconductor field-effect transistors (MOSFETs) in which an oxide film breaks down as the result of long-term application of relatively low electric fields, as opposed to immediate breakdown caused to application of a strong electric field. In this regard, the times at which defects (e.g., TDDB defects) occur in wafers (or a distribution of defect over time) may be understood as defect information data useful in the evaluation of defect rates and defect types associated with wafers.

SUMMARY

Embodiments of the inventive concept provide devices and methods providing a distribution for defect characteristics by classifying defect times for each defect characteristic of a wafer.

According to an embodiment of the inventive concept, there is provided an operating method for a distribution output device. The operating method includes; setting a data number set for a plurality of data groups to be classified in an order of occurrence for defect times, designating defect times across the plurality of data groups based on the data number set, calculating a likelihood summation by summing likelihoods respectively corresponding to the plurality of data groups, determining whether the likelihood summation replaces a maximum likelihood summation, determining optimal population parameter data for each of the plurality of data groups in relation to the maximum likelihood summation, and outputting a Weibull distribution for each of the plurality of data groups in relation to the optimal population parameter data for each of the plurality of data groups.

According to an embodiment of the inventive concept, there is provided an operating method for a distribution output device. The operating method includes; generating data number sets for data groups, grouping defect times according to an order in which the corresponding defects occurred in relation to each of the data number sets, calculating likelihood summations respectively corresponding to the data number sets in relation to defect times grouped in accordance with the data number sets, determining a maximum likelihood summation among the likelihood summations, determining optimal population parameter data for each of the data groups in relation to the maximum likelihood summation, and outputting a Weibull distribution for each of the data groups in relation to the optimal population parameter data for each of the data groups.

According to an embodiment of the inventive concept, there is provided a device outputting a data distribution including; a calculation unit configured to generate a data number set for data groups respectively classified according to an order of occurrence for defect times, designate defect times data across the data groups based on the data number set, calculate a likelihood summation by summing likelihoods respectively corresponding to the data groups, and determining whether the likelihood summation replaces a maximum likelihood summation, a population parameter determining unit configured to determine optimal population parameter data for each of the data groups in relation to the maximum likelihood summation, a distribution outputting unit configured to output a Weibull distribution of each of the data groups in relation to the optimal population parameter data for each data group, and a memory configured to store, as stored information, at least one of the defect times, the likelihood summations, and the maximum likelihood summation and further configured to provide the stored information in response to a request from at least one of the calculation unit, the population parameter determining unit and the distribution outputting unit.

BRIEF DESCRIPTION OF THE DRAWINGS

Embodiments of the inventive concept may be more clearly understood upon consideration of the following detailed description together with the accompanying drawings in which:

FIG. 8 is a table listing examples of determining a data number set having a maximum likelihood summation during a plurality of updates according to embodiments of the inventive concept;

DETAILED DESCRIPTION

Throughput the written description and drawings, like reference numbers and labels will be used to denote like or similar elements, method steps and/or features. Hereinafter, embodiments of the inventive concept will be described in some additional detail with reference to the accompanying drawings.

Figure 1:
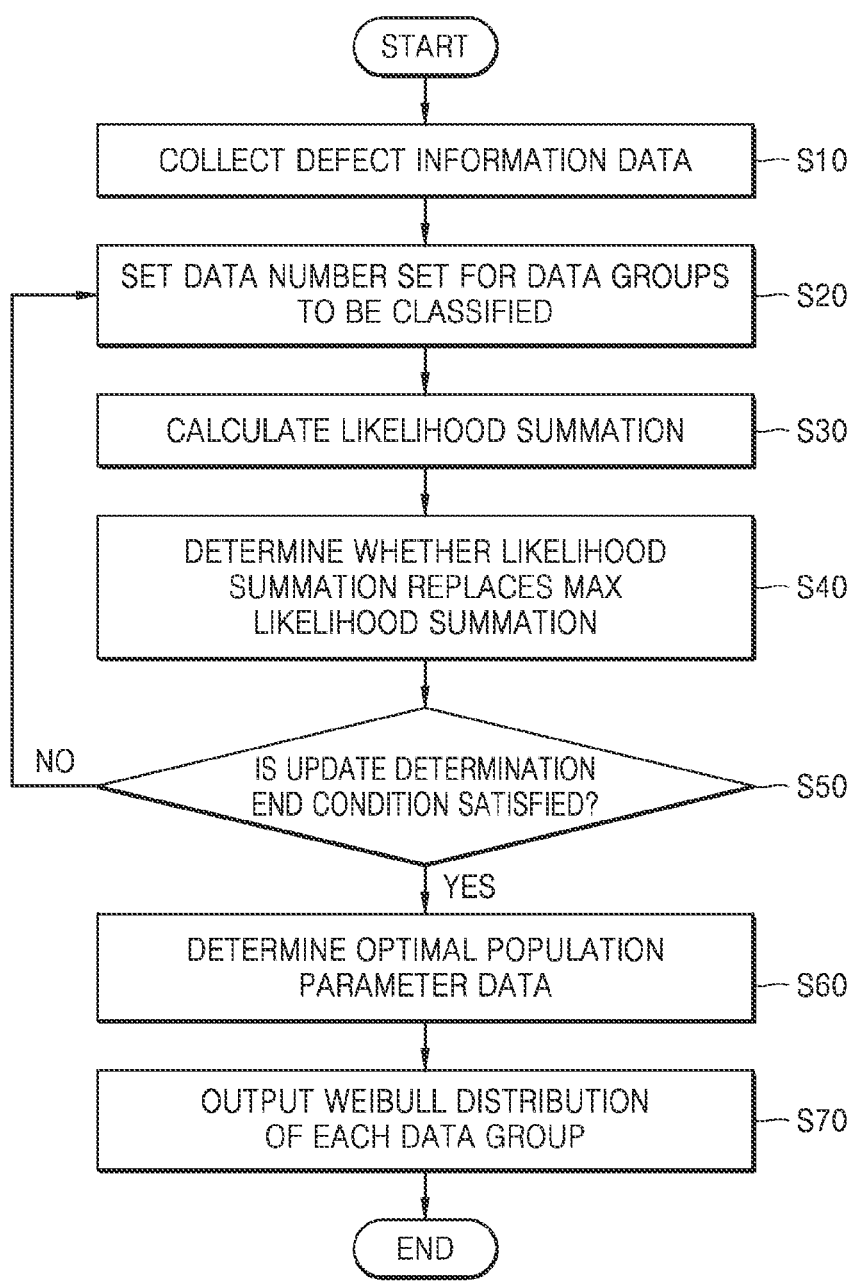
FIG. 1 is a flowchart illustrating an operating method for a distribution output device according to embodiments of the inventive concept.

Figure (FIG. 1 is a flowchart illustrating an operating method for a device providing a distribution of data (hereafter, a "distribution output device") according to embodiments of the inventive concept.

Here, the distribution output device may collect (or receive) data indicating the times at which one or more defects occurs (hereafter, "defect times") in relation to a wafer being tested (hereafter, the "test wafer"). That is, following the fabrication of a semiconductor device (or related material layer(s), element(s) and/or component(s)) on a wafer, the wafer is may be evaluated for quality, wherein the quality evaluation of the test wafer may generate data identifying one or more types of defects, as well as corresponding defect times for the defects. (Hereafter, data describing defects and/or defect times will be termed "defect information" or "defect information data"). Once collected, the defect information data may be variously classified according to type and/or defect time to generate into a plurality of "data groups." Thereafter, a data distribution for data group may be determined.

The distribution output device may be variously implemented in hardware, software and/or firmware. For example, the distribution output device may be controlled by a processor executing one or more programs to perform various operations, such as loading data from a memory associated with the distribution output device, receiving defect information data from one or more external source(s), outputting data distributions to one or more external circuits or memories, etc. In this regard, the distribution output device may include an input interface and/or an output interface operated in relation to one or more data communication protocols.

Referring to the flowchart of FIG. 1, the distribution output device may collect defect information data (e.g., a listing or notation of identified defects and/or a listing or notation of their corresponding defect times) (S10). That is, in some embodiments, a number of defects occurring across a test wafer may be identified and their corresponding defect times noted. Here, the "collecting" of defect information data may include active, real-time testing and/or receiving previously collected defect information data for the test wafer from an external source.

Once the defect information data has been collected (S10), the distribution output device may define (or "set") a data number for a plurality of data groups to be classified (S20). In some embodiments, each data group may include defect times grouped around (e.g., relatively proximate to) a particular defect time. Hence, the distribution output device may divide the collection of defect times by a number of data groups in order to set the data number set of method step S20. For example assuming a collection of ten (10) defect times, and three (3) data groups, the data number set may be any one of (0, 0, 10), (0, 1, 9), (0, 2, 8) . . . (9, 1, 0), and (10, 0, 0).

The distribution output device may calculate a likelihood for each data group classified according to the data number set, and then calculate a likelihood summation by summing the respective data group likelihoods (S30). For example, the distribution output device may respectively calculate a first likelihood, a second likelihood and a third likelihood for a first data group, a second data group and a third data group. Then, the distribution output device may calculate the (total) "likelihood summation" by summing the first, second and third likelihoods. One approach to the calculation of the likelihood summation will be described in some additional detail hereafter in relation to FIG. 6.

Once the likelihood summation has been calculated (S30), the distribution output device may compare the likelihood summation to a maximum likelihood summation in order to determine whether the likelihood summation should be substituted for (replace) the maximum likelihood summation (S40). Here, the "maximum likelihood summation" may be a likelihood summation having a greatest value among all previously calculated likelihood summations corresponding to previous data number sets. For example, assuming that the distribution output device calculates a likelihood summation according to a fifth data number set, a fifth-calculated likelihood summation may be compared to a maximum likelihood summation having the greatest value among likelihood summations calculated in relation to the previous first through fourth data number sets. Under this assumption, the distribution output device may determine that the fifth-calculated likelihood summation should be a new maximum likelihood summation when the fifth-calculated likelihood summation is greater than all previously calculated likelihood summations.

Then, the distribution output device may determine whether an additional update of the maximum likelihood summation is necessary (S50). For example, the additional update of the maximum likelihood summation may indicate classifying defects times into data groups based on a new data number set, different from a previous data number set, and then calculating a likelihood for each data group to calculate new likelihood summation(s). Thus, when it is determined that an additional update of the maximum likelihood summation is necessary (S50=YES) (e.g., because an update determination end condition is not satisfied), the distribution output device may again set a data number set (S20). Otherwise, when it is determined that an additional update of the maximum likelihood summation is not necessary (S50=NO), the distribution output device may proceed to step S60 of the operating method. One approach to the determination of whether an additional update of the maximum likelihood summation is necessary will be described in some additional detail hereafter in relation to FIG. 11.

Once the distribution output device determines that an additional update of the maximum likelihood summation is not necessary (S50=NO), a determination of an optimal population parameter data may be made based on the maximum likelihood summation (S60). Here, the optimal population parameter data may indicate population parameter data for each data group classified in relation to the data number set corresponding to the maximum likelihood summation. The optimal population parameter data may include (e.g.,) shape information and scale information for each data group, wherein shape information and scale information may be parameters calculated in relation to defect times included in each data group. In this regard, the shape information may be referred to as a process spread, and the scale information may be referred to as a central lifespan value.

Once the optimal population parameter data has been determined (S60), the distribution output device may output a Weibull distribution based on the optimal population parameter data for each data group (S70). That is, the distribution output device may output a number of Weibull distributions equal to the number of data groups, and may also output a vulnerability degree for a defect characteristic corresponding to each data group. For example, assuming that the distribution output device has classified defect times into three (3) data groups, each one of the three data groups may be deemed an extrinsic defect group, an intrinsic defect group or a robust intrinsic defect group. Accordingly, the distribution output device may output a data distribution according to each defect characteristic. For example, when shape information (e.g., a relatively high shape information value) is output for a distribution associated with an extrinsic defect group, a user may determine that the test wafer should be characterized as being more vulnerable to extrinsic defect(s).

Certain comparative devices may output a Weibull distribution for a single data group. However, distribution output devices according to embodiments of the inventive concept may output Weibull distribution(s) by dividing defect times into different data groups, such that a user may more accurately assess a data distribution for different defect characteristics. In addition, distribution output devices according to embodiments of the inventive concept may more accurately classify defects and corresponding defect times in relation to various defect characteristics according to a consistency degree with a Weibull distribution in the process of classifying the defect times into the data groups.

Figure 2:
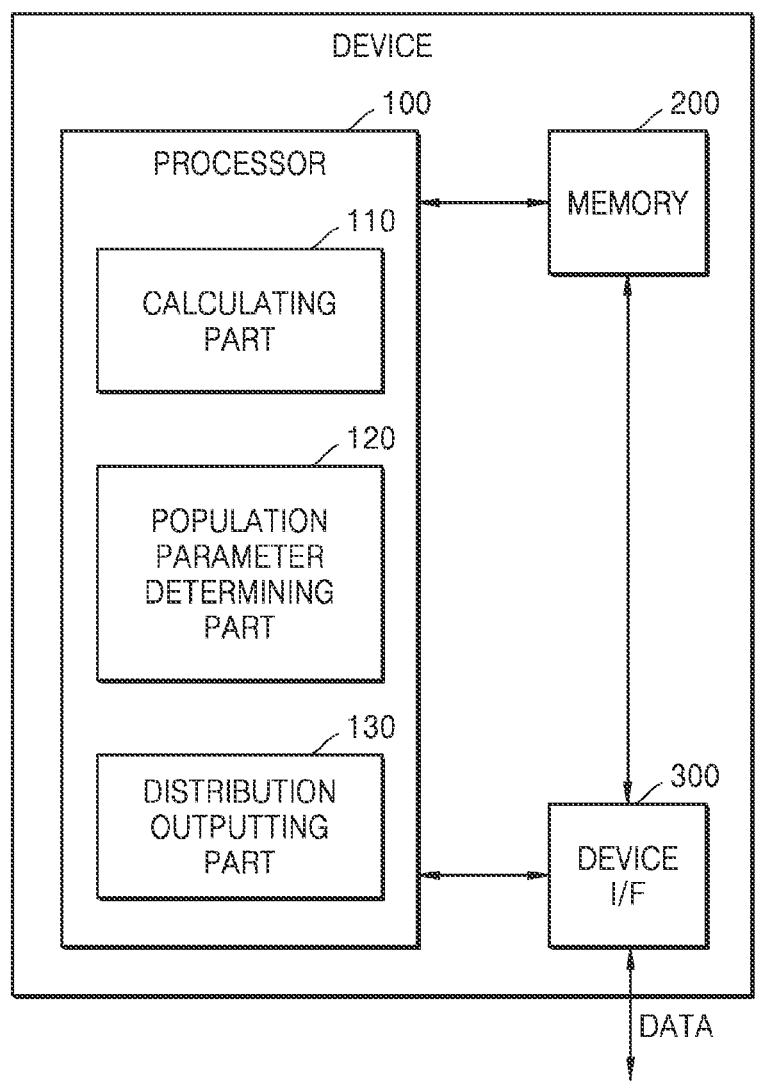
FIG. 2 is a block diagram illustrating a distribution output device according to embodiments of the inventive concept.

FIG. 2 is a block diagram illustrating a distribution output device 10 according to embodiments of the inventive concept.

Referring to FIG. 2, the distribution output device 10 may include a processor 100, a memory 200, and a device interface 300. The device interface 300 may enable communication (e.g., transmission and/or reception) of data with one or more external devices. The processor 100 may load data received from an external source through the device interface 300, and store the received data in the memory 200. In this regard, the processor 100 may perform various computational and/or data processing operations, such as those used to collect defect information data, define a data number set for data groups, calculate likelihood summations for each data group, compare each calculated likelihood summation to a maximum likelihood summation, determine an optimal population parameter data, and/or output a Weibull distribution for each group based on the optimal population parameter data.

In some embodiments, the processor 100 may include a calculating part 110, a population parameter determining part 120, and a distribution outputting part 130. Here, each of the components provided by the processor 100 may variously implemented in hardware, software (e.g., one or more software routines or modules) or a combination hardware/software.

Thus, in some embodiments, the memory 200 may receive, store, and provide data directly to/from the device interface 300, and/or to/from the processor 100. In this regard, the memory 200 may be used to map a likelihood summation and population parameter data calculated by the processor 100 to a data number set by at least temporarily storing a mapping result, and by storing a maximum likelihood summation updated based on a comparison result between the likelihood summation and a maximum likelihood summation. When the processor 100 determines that an maximum likelihood summation update determination end condition has been satisfied, the memory 200 may provide a data number set and population parameter data mapped to the maximum likelihood summation to the processor 100, and the processor 100 may output a distribution for each data group based on the data number set and the population parameter data corresponding to the maximum likelihood summation.

Accordingly, the device interface 300 may communicate various data to/from one or more external source in a hardwired and/or wireless environment in order to provide data to the memory 200 and/or the processor 100. For example, the device interface 300 may be used to receive defect information data generated by one or more quality evaluation processes performed on a test wafer and designed to identify defects and/or corresponding defect times to the processor 100 and/or the memory 200. The device interface 300 may also be used to communicate a distribution and/or population parameter data for each data group provided by the processor 100 to the one or more external circuit(s) or memor(ies).

Figure 3:
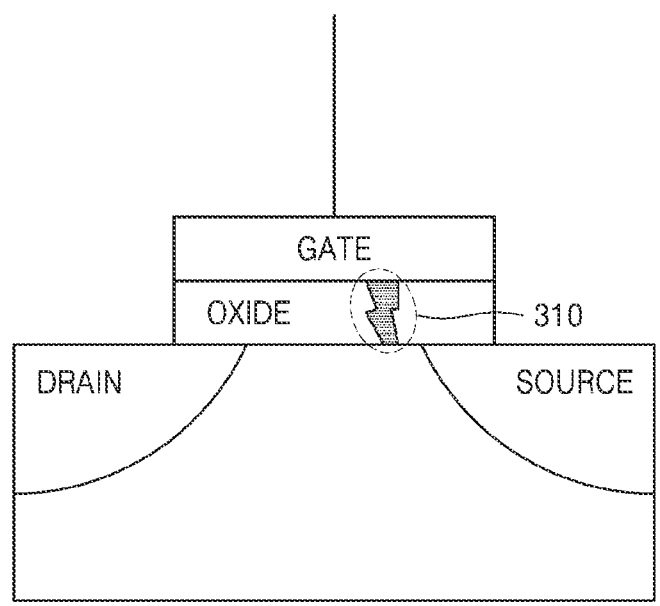
FIG. 3 is a cross-sectional view illustrating a defect in a MOSFET.

FIG. 3 is a cross-sectional diagram illustrating the occurrence of a defect in a gate oxide film of a transistor (e.g., a MOSFET).

Here, the illustrated defect in the gate oxide film of FIG. 3 is just one type of defect that may occur in a test wafer. As noted above, the gate oxide film may fail upon application of an overvoltage. However, the gate oxide film may also deteriorate, and ultimately fail, in response to a long-duration application of relatively low voltages (e.g., a TDDB defect).

In FIG. 3, a TDDB defect 310 may occur in the oxide film due to an oxide film breakdown (e.g., pin hole formation or the like) related to a relatively weak portion of the oxide film or due to adverse material characteristics. Because the TDDB defect 310 allows a high level of leakage current, the MOSFET suffering the TDDB defect 310 may not operate, thereby potentially causing a failure in the constituent semiconductor circuit. The TDDB defect 310 may occur at numerous points across the test wafer in response to quality evaluation and testing (e.g., the selective application of test voltage(s) and/or current(s) to the test wafer). However, a distribution output device according to embodiments of the inventive concept may be used to collect distribution output data associated with these defects and/or receive distribution output data previously generated by an external device.

Figure 4:
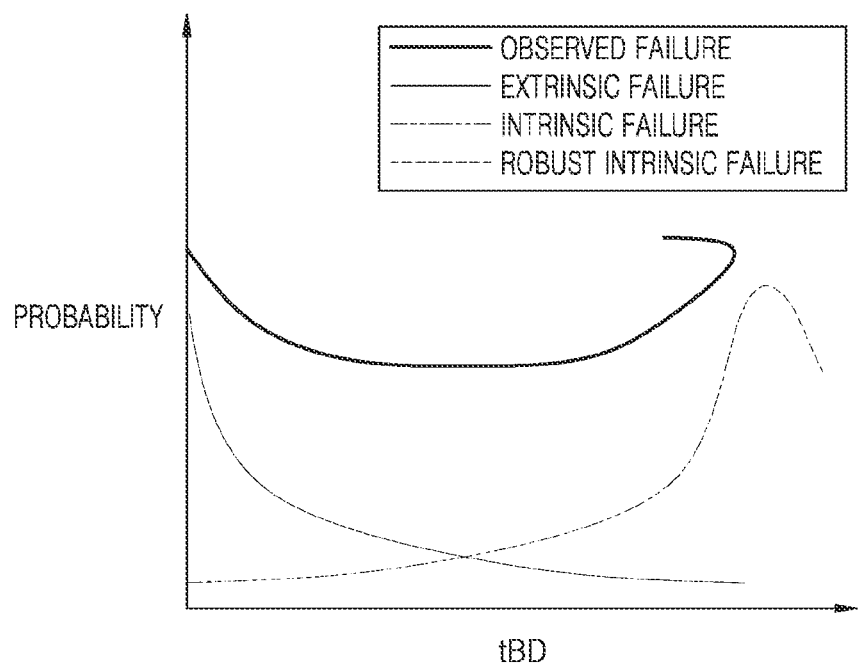
FIG. 4 is a graph illustrating various types of defect characteristics.

FIG. 4 is a graph illustrating defect times for a particular defect characteristic.

Referring to FIG. 4, a probability distribution—i.e., probability of occurrence as a function of time-to-breakdown (tBD)—for defect times corresponding to defects occurring over time may be generated. In this regard, each occurring defect (e.g., TDDB defect 310) may be classified as an extrinsic defect, an intrinsic defect, or a robust intrinsic defect according to predetermined properties commonly associated with defects. For example, an "extrinsic defect" is a defect occurring due to a fabrication process related problem. Such extrinsic defects usually occur intensively and shortly after the performing of the problematic process. An "intrinsic defect" is a defect that more gradually occurs over time, usually as the result of performing an increasing number of operations in a semiconductor circuit including the oxide film. Hence, intrinsic defects may be understood as lifespan related defects. A "robust intrinsic defect" is a certain type of intrinsic defect occurring after a period of time normally associated with intrinsic defects and may be understood as noise in the calculation of lifespan related defects. That is, from a user's standpoint, an intrinsic defect may be a defect naturally occurring according over time as an electronic device is operated, whereas an extrinsic defect is a defect occurring relatively soon after beginning operation of the electronic device. Hence, an extrinsic defect rate may be directly related to a process spread. Accordingly, certain defects, like TDDB defects, associated with different defect characteristic may be identified according to their occurrence in initial stages of electronic device operation or in later stages of the electronic device operation. That is, various defects may be reasonably well identified according to their corresponding defect times.

In some embodiments, it may be significant to determine the distribution of defect times according to defect characteristics, and calculate a defect rate for each defect characteristic. However, according to existing comparative examples, only defect times generally associated with occurring defects may be determined. Therefore, it is difficult to determine for each defect, a corresponding defect characteristic. In great contrast, distribution output devices according to embodiments of the inventive concept may output data distributions that may be readily visualized and understood by users. That is, vulnerable defect characteristics among the defect characteristics may be better identified in relation to data groups including defects grouped according to defect times for each defect characteristic, and in relation to a distribution provided for each of these data groups.

Figure 5:
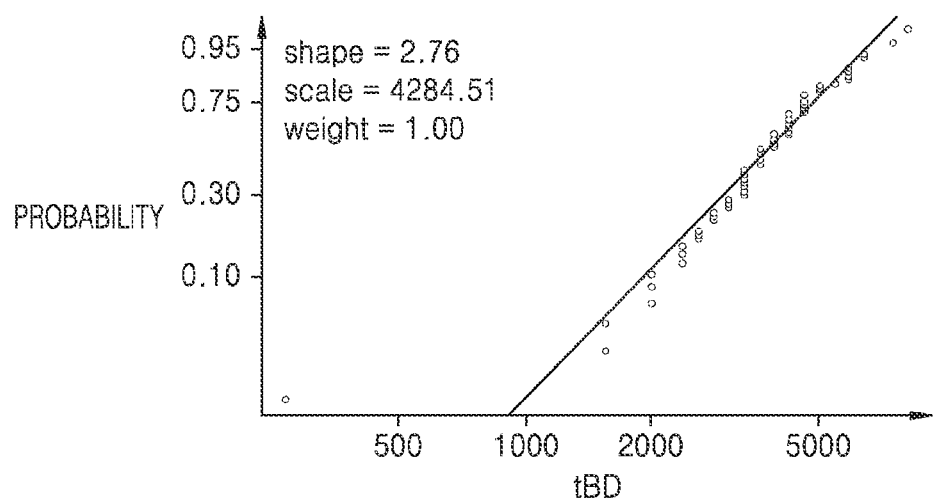
FIG. 5 is a graph illustrating a Weibull distribution for defect times according to a comparative example.

FIG. 5 is a graph illustrating a Weibull distribution for defect times associated with a comparative example.

Here, a comparative device may be used to calculate shape information and scale information based on defect times, and generate a distribution for the defect times based on the shape information and the scale information. For example, the comparative device may output the distribution of the defect times using a Weibull distribution. The comparative device may discretely align the defect times in an earlier order of the defect times in order to visualize a cumulative distribution function (CDF) over a sampling period during which the defect times are collected. In this regard, the comparative device may visualize the defect times in relation to the CDF according to a Weibull distribution. A probability density function for the Weibull distribution may be represented by Equation 1.

$$f(x; k, \lambda) = \frac{k}{\lambda}\left(\frac{x}{\lambda}\right)^{k-1} e^{-(x/\lambda)^k}$$ [Equation 1]

Here, 'k' denotes scale information and may be a parameter indicating a central lifespan value, and 'λ' denotes shape information and may be a parameter indicating a process spread.

In contrast, the distribution output device 10 of FIG. 2 may determine shape information and scale information based on a CDF by which defect times may be discretely visualized. For example, the distribution output device 10 of FIG. 2 may estimate a linear function most similar to a discrete CDF for defect times, and determine a slope of the linear function as the shape information. In addition, the distribution output device 10 of FIG. 2 may determine the shape information and the scale information according to a distribution degree for defect times, wherein the lesser the data spread, the larger value the shape information may have. A value of the scale information may be proportional to a data value. For example, when data generally has a large value, the scale information may have a large value.

According to the comparative example of FIG. 5, the shape information and the scale information for the defect times may be 2.76 and 4284.51, respectively.

Referring to FIGS. 4 and 5, various defects (e.g., TDDB defects) may be identified as an extrinsic defect, an intrinsic defect, or a robust intrinsic defect according to defect characteristics, and a comparative device may digitize an occurrence distribution for defects times based on the entirety of defects times. Thus, a defect occurrence distribution for each defect characteristic is difficult, if not impossible, to effectively visualize and determine. In contrast, however, a distribution output device according to embodiments of the inventive concept may readily determine optimal population parameter data for each data group, and output a distribution based on the optimal population parameter data. And as a result, a defect occurrence distribution for each defect characteristic may be readily determined, so that a user may more accurately perceive to which defect characteristic a test wafer is vulnerable.

Figure 6:
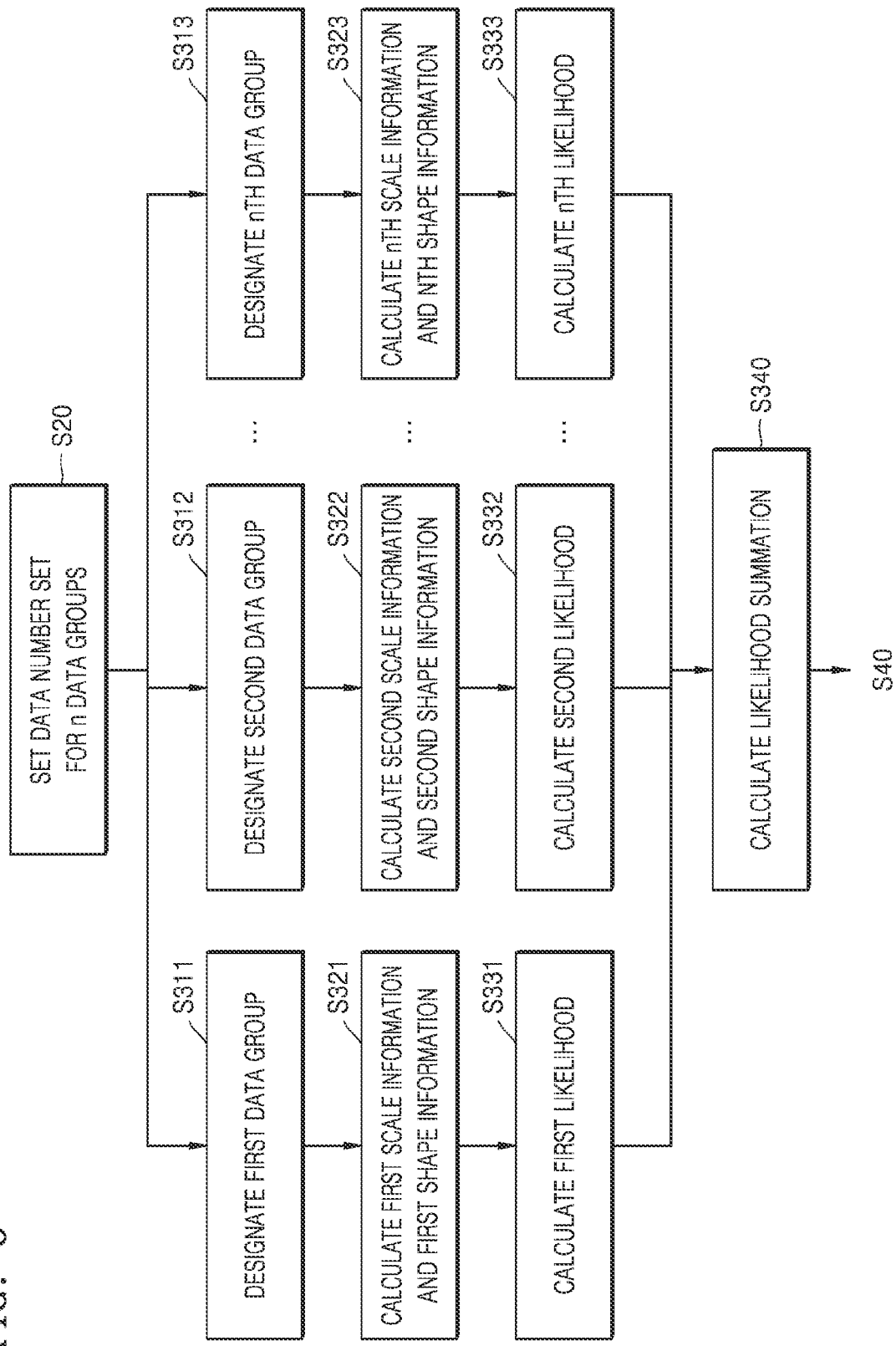
FIG. 6 is a flowchart illustrating a method of calculating a likelihood summation for data groups according to embodiments of the inventive concept.

FIG. 6 is a flowchart illustrating a method of calculating a likelihood summation for data groups according to embodiments of the inventive concept.

Referring to FIGS. 1, 2 and 6, it is assumed that the distribution output device 10 is used to perform the method of FIG. 1 in order to calculate the likelihood summation for the data groups (e.g., S30).

Accordingly, the method of FIGS. 1 and 6 may set a data number set for n data groups (where 'n' is a natural number greater than 1) (S20), and calculate likelihoods for each of the n data groups—then calculate a (total) likelihood summation (S30). For example, assuming three (3) data groups corresponding to an extrinsic defect group, an intrinsic defect group, and a robust intrinsic defect group are set, the distribution output device 10 may generate the likelihood summation by respectively calculating three (3) likelihoods corresponding to the three data groups and then summing the three calculated likelihoods.

In method step S20, the distribution output device 10 may set a data number set for n data groups. The distribution output device 10 may set the data number set by dividing the total number of collected defect times by 'n'—which is the number of data groups. In this case, the distribution output device 10 may set an initial value of the data number set based on a pre-designated ratio. For example, when three data groups are set, 10% of the total number may be set as a number of defect times included in a first data group, 80% thereof may be set as a number of defect times included in a second data group, and the remaining 10% may be set as a number of defect times included in a third data group. That is, when the total number of defect times is 10, for example, the distribution output device 10 may set an initial value of the data number set so as to allocate one (1) defect time to the first data group, eight (8) defect times to the second data group, and one (1) defect time to the third data group.

After setting the initial value, when the distribution output device 10 sets a new data group (e.g., during a subsequent update determination step), the distribution output device 10 may set, as a new data number set, a data number set having a relatively small difference with the initial value. For example, the distribution output device 10 may set a data number set by increasing a number of defect times allocated to the first data group by 1, and decreasing the number of defect times allocated to the second data group by 1. That is, assuming an initial value for the data number set is (1, 9, 1), the distribution output device 10 may reset the data number set to (2, 8, 1) as a new data number set in a subsequent update determination step.

With this background in mind and referring to FIG. 6, the distribution output device 10 may designate (or distribute) defect times among the first through nth data groups (e.g., in the order in which the defect times are collected and/or received) (S311, S312, S313). Thus, when a designation order for the data groups is set in accordance with the order of defect time occurrence, the distribution output device 10 may allocate the defect times in a manner well aligned with the order of defect occurrence among the data groups. For example, when the number of defect times is 10, a data number set for three data groups may be set to (3, 4, 3), and data may be allocated in an order of the first data group, the second data group, and the third data group. That is, the distribution output device 10 may allocate the three (3) earliest-occurring defect times among the 10 defect times to the first data group; allocate the next four earliest-occurring defect times to the second data group (omitting the three earliest-occurring defect times designated to the first group); and allocate the three most recently-occurring defect times to the third data group. As described above in relation to FIG. 4, because defect characteristics may generally be identified in relation to defect times, the distribution output device 10 may timewise 'group' defect times among the data groups according to an order in which the defects occurred (or according to time-proximate defect times).

Thereafter, the distribution output device 10 may calculate scale information and shape information for each of the first, second and third data groups (S321, S322, S323). Here, the distribution output device 10 may calculate the scale information and the shape information of each data group based on a distribution of the defect times designated to each data group. In some embodiments, the distribution output device 10 may (1) regenerate a CDF for each one of the first, second and third data groups; (2) determine—as scale information—a slope of a linear function corresponding to the CDF; and (3) determine—as shape information—a spread degree for the defect times. However, distribution output devices according to embodiments of the inventive concept are not limited to the foregoing embodiment, and scale information and shape information may be variously calculated based on a collected discrete probability distribution.

Next, the distribution output device 10 may calculate a likelihood based on the scale information and the shape information for each of the first, second and third data groups (S331, S332, S333). In some embodiments, the distribution output device 10 may determine—as a weighting for each data group, a ratio of a number of defect times for each data group to a total number of defect times, and then calculate a likelihood using Equation 2.

$$f(t\mid\theta)=\sum_{i=1}^{m}\omega_{i}\left(\frac{\beta_{i}}{\alpha_{i}}\right)\left(\frac{t}{\alpha_{i}}\right)^{\beta_{i}-1}\exp\left[-\left(\frac{t}{\alpha_{i}}\right)^{\beta_{i}}\right] \quad \text{[Equation 2]}$$

Here, 'α' denotes a scale population parameter, 'β' denotes a shape population parameter, and 'ω' denotes a weight, wherein 'f(t|θ)' is a likelihood of a Weibull distribution, and the likelihood may indicate a value indicating a consistency degree of a population parameter of a probability distribution with respect to a sampling value of a certain probability variable. In particular, a likelihood of a population parameter with respect to a given sampling value may be a probability of a given observed value granted in a distribution following the population parameter. That is, the likelihood of the Weibull distribution may be a value indicating a consistency degree of the Weibull distribution having, as population parameter data, the scale information and the shape information for each data group, which are calculated in method steps S321, S322 and S323, with respect to a distribution of defect times designated to each data group. Therefore, a high likelihood may indicate that the Weibull distribution and the distribution of the defect times for each data group have a high consistency degree.

Then, the distribution output device 10 may calculate a likelihood summation by summing the likelihoods calculated in method steps S331, S332 and S333 (S340). In some embodiments, the likelihood summation may be a logarithmic value of a summed value of likelihood summations for the respective data groups, and may be derived using Equation 3.

$$l(t;\theta)=\sum_{j=1}^{n}\ln[f(t_{j}\mid\theta)] \quad \text{[Equation 3]}$$

In some embodiments, the distribution output device 10 may compare the likelihood summation to an existing maximum likelihood summation in order to determine whether or not an update of the maximum likelihood summation is necessary. One approach to this will be described in some additional detail hereafter in relation to FIG. 7.

Figure 7:
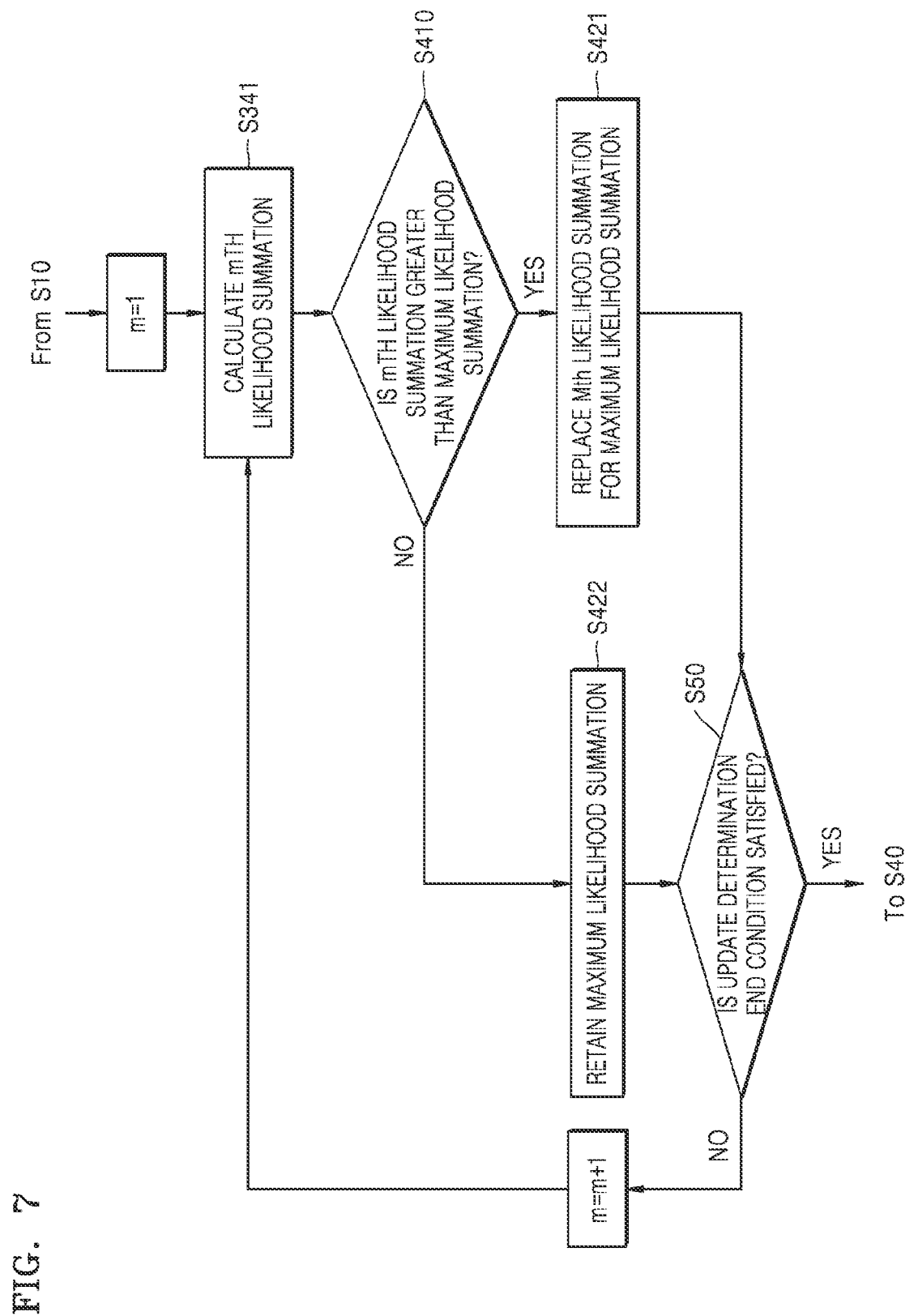
FIG. 7 is a flowchart illustrating a method of determining a maximum likelihood summation until update determination ends according to embodiments of the inventive concept.

FIG. 7 is a flowchart illustrating a method that continues to determine a maximum likelihood summation until an end condition is satisfied according to embodiments of the inventive concept.

In this regard, it should be noted that FIG. 6 is a flowchart illustrating an operating method in which the distribution output device 10 of FIG. 2 may set one data number set and calculate one likelihood summation according to the set data number set, and FIG. 7 is a flowchart illustrating an operating method in which the distribution output device 10 may iteratively set different data number sets and continuously determine whether to update the maximum likelihood summation.

Here, in FIG. 7, the distribution output device 10 may calculate an mth likelihood summation (where 'm' is a natural number) by the likelihood summation calculation method described in relation to FIG. 6. Assuming a likelihood summation has not been previously calculated, the distribution output device 10 may calculate the likelihood summation using a new data number set different from a data number set used to calculate a previous likelihood summation. The new data number set may be an adjacent data number set having a small difference with the data number set used to calculate the previous likelihood summation, and the adjacent data number set may be, for example, a data number set having a difference between a number of defect times for each data group and that of a previous data number set is 2 or less.

In some embodiments, when a likelihood summation is first calculated, the distribution output device 10 may calculate a first likelihood summation based on an initial value of a data number set, and then set the first likelihood summation as a maximum likelihood summation. Thereafter, in step S341, the distribution output device 10 may calculate a likelihood summation based on a new data number set different from the initial value of the data number set.

Then, the distribution output device 10 may compare the mth likelihood summation to the maximum likelihood summation (S410). The maximum likelihood summation may be a likelihood summation having the greatest value among first to (m−1)th likelihood summations previously calculated likelihood summations. As a result of the comparison, when the mth likelihood summation is greater than the maximum likelihood summation (S410=YES), the distribution output device 10 may proceed to method step S421, otherwise when the mth likelihood summation is not greater than the maximum likelihood summation (S410=NO), the distribution output device 10 may proceed to method step S422.

Thus, when it is determined that the mth likelihood summation is greater than the maximum likelihood summation (S410=YES), the distribution output device 10 may update the maximum likelihood summation by replacing the mth likelihood summation for the maximum likelihood summation (S421). However, when it is determined that the mth likelihood summation is not greater than the maximum likelihood summation (S410=NO), the distribution output device 10 may retain the existing maximum likelihood summation (S422). In this manner, the distribution output device 10 may continuously calculate a likelihood summation based on a new data number set to determine whether to update the maximum likelihood summation, and determine, as the maximum likelihood summation, the greatest one of likelihood summations corresponding to different data number sets.

Thus, in relation to the method steps S50 of the FIG. 2, the distribution output device 10 may determine whether a number of update determinations or a number of likelihood summation replacement is sufficient to satisfy one or more predetermined end condition(s), and when it is determined that the update determination end condition(s) have been satisfied, the distribution output device 10 may proceed to method step S60 to determine optimal population parameter data. One approach to updating determination end condition(s) will be described in some additional detail hereafter in relation to FIG. 11.

FIG. 8 is a table listing examples of determining a data number set having a maximum likelihood summation through multiple updates.

Referring to FIG. 8, it is assumed that the distribution output device 10 collects a total of 57 discrete defect times and calculates a likelihood summation based on a different data number set in every update determination. For example, in a $52^{nd}$ update determination, the distribution output device 10 may allocate three (3) defect times to the first data group, forty-six (46) defect times to the second data group, and eight (8) defect times to the third data group. Then, in a $53^{rd}$ update determination, the distribution output device 10 may again allocate three (3) defect times to the first data group, forty-five (45) defect times to the second data group, and nine (9) defect times to the third data group.

The distribution output device 10 may at least temporarily store a likelihood summation corresponding to each data number set, and determine whether to update a maximum likelihood summation that is the greatest likelihood summation among previously calculated likelihood summations by comparing the maximum likelihood summation to a calculated likelihood summation. Referring to FIG. 8, the distribution output device 10 has performed 54 or more update determinations and may determine the greatest calculated likelihood summation as the maximum likelihood summation based on a $53^{rd}$ data number set.

The distribution output device 10 may determine shape information, scale information, and weighting corresponding to the maximum likelihood summation as optimal population parameter data. Referring to FIG. 8, the distribution output device 10 may determine information regarding the three (3) defect times in the first data group as first optimal population parameter data for the first data group; determine information regarding the forty-five (45) defect times in the second data group as second optimal population parameter data for the second data group; and determine information regarding the nine (9) defect times in the third data group as third optimal population parameter data for the third data group.

Figure 9:
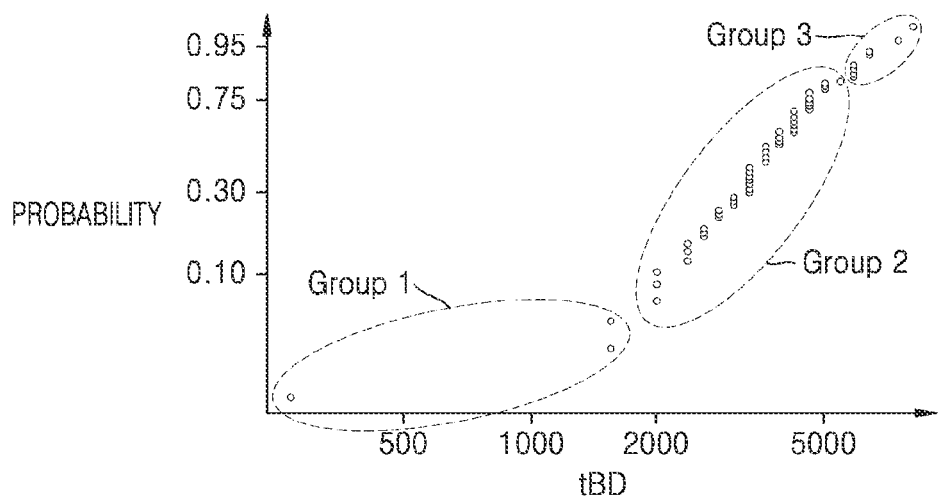
FIG. 9 is a graph illustrating an example in which defect times are designated across a plurality of data groups according to embodiments of the inventive concept.
Figure 10:
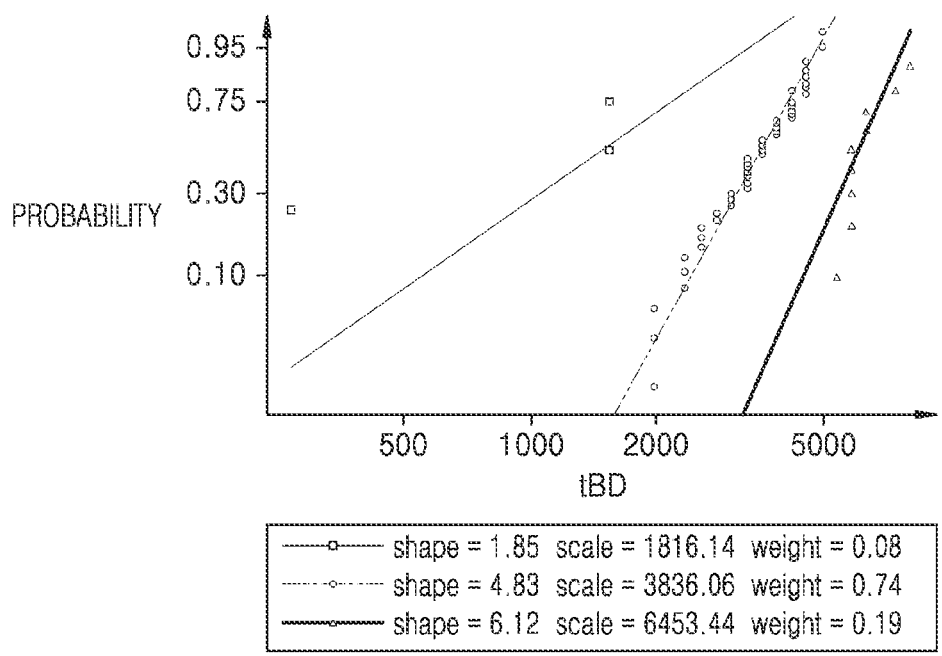
FIG. 10 is a graph illustrating Weibull distributions for defect times designated across the plurality of data groups.

FIG. 9 is a graph illustrating an example in which defect times are designated across a plurality of data groups according to embodiments of the inventive concept, and FIG. 10 is a graph illustrating a collection of Weibull distributions for the defect times designated across the plurality of data groups.

Referring to FIGS. 2, 9 and 10, the distribution output device 10 may group defect times in accordance with a data number set corresponding to a maximum likelihood summation and output a distribution for the defect times for each data group. Referring further to FIG. 8, when the three (3) defect times, the forty-five (45) defect times, and the nine (9) defect times are respectively allocated to the first data group, the second data group, and the third data group in accordance with the data number set corresponding to the maximum likelihood summation, the distribution output device 10 may allocate the defect times to the first data group, the second data group, and the third data group according to an order in which the defect times occurred.

Referring to FIG. 10, the distribution output device 10 may output a Weibull distribution for each data group. The distribution output device 10 may use shape information, scale information, and weighting for each data group as optimal population parameter data corresponding to each data group, and visualize defect times for each data group based on corresponding information. For example, when a shape information value is large, a slope of a linear function of a distribution corresponding to a data group may be large, and this may be visualized in such a manner that a user may determine that a process spread of a defect characteristic corresponding to a corresponding data group is good. That is, the user may readily understand a process spread in relation to each defect characteristic using the a visualized distribution.

Figure 11:
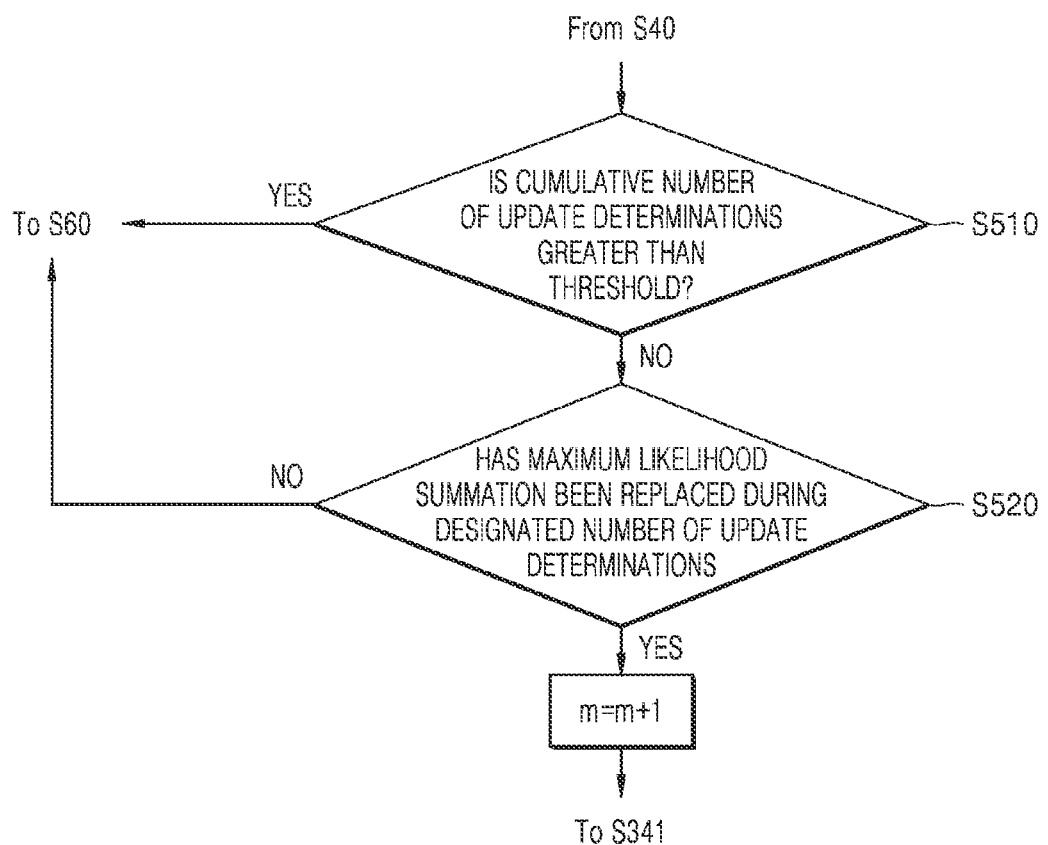
FIG. 11 is a flowchart illustrating a method of determining when an update cycle ends according to embodiments of the inventive concept.

FIG. 11 is another flowchart illustrating an operating method for determining when an update cycle ends according to embodiments of the inventive concept.

Referring to FIGS. 2 and 11, the distribution output device 10 may determine whether to update a maximum likelihood summation, and then determine whether to calculate a new likelihood summation by setting a new data number set. That is, the distribution output device 10 may determine optimal population parameter data without performing an additional update when an update termination condition is satisfied, and perform an additional update when the update termination condition is not satisfied.

The distribution output device 10 may determine whether a cumulative number of update determinations is greater than a threshold (S510). The cumulative number of update determinations is the number of additional updates performed after first calculating a likelihood summation, and according to an embodiment, the cumulative number of update determinations may indicate the number of additional updates performed after calculating a likelihood summation from an initial value of a data number set. The threshold may be a pre-designated value, and when the cumulative number of update determinations is greater than the threshold, the distribution output device 10 may determine that an additional update is not performed because the maximum likelihood summation has been updated based on an enough number of data number sets.

The distribution output device 10 may determine whether the maximum likelihood summation has been replaced during a designated number of update determinations (S520).

That is, the distribution output device 10 may end an update when it is predicted that the maximum likelihood summation is not replaced even though a new likelihood summation is calculated through an additional update because the maximum likelihood summation has been sufficiently replaced by updates. However, embodiments of the inventive concept are not limited to only the foregoing operating method wherein the distribution output device 10 determines whether the update determination end condition has been satisfied.

Compared with embodiments wherein a distribution output device calculates a maximum likelihood summation according to data number sets for all options, embodiments of the inventive concept determining whether to perform an additional update may more efficiently calculate a maximum likelihood summation, thereby reducing calculation time and the use of system resources.

While the inventive concept has been particularly shown and described with reference to embodiments thereof, it will be understood that various changes in form and details may be made therein without departing from the spirit and scope of the following claims.

What is claimed is:

1. A method for identifying defects on a plurality of semiconductor devices, the method comprising:
   performing, using at least one of one or more external computing devices, a quality evaluation process by selectively applying at least one of a test voltage or a test current to each of a plurality of wafers;
   generating, using the at least one of the one or more external computing devices, defect information data of defect characteristics identified in the plurality of wafers on which the quality evaluation process is performed;
   establishing, using a communication interface of a distribution output device, data communication with the at least one of the one or more external computing devices;
   receiving, using the communication interface and from the at least one of the one or more external computing devices, the defect information data of defect characteristics identified in the plurality of wafers, the defect information data including defect times associated with the defect characteristics;
   setting, using at least one processor of the distribution output device, a data number set for a plurality of data groups to be classified in an order of occurrence for the defect times, the plurality of data groups corresponding to different defect characteristics among the defect characteristics and the data number set comprising a specified number of defect times for each of the plurality of data groups;
   designating, using the at least one processor, the defect times across the plurality of data groups based on the data number set;
   determining, using the at least one processor, whether a likelihood summation based on likelihoods respectively corresponding to the plurality of data groups replaces a maximum likelihood summation;
   determining, using the at least one processor, optimal population parameter data for each of the plurality of data groups in relation to the maximum likelihood summation;
   transmitting, using the communication interface and to at least one of the one or more external computing devices, a Weibull distribution for each of the plurality of data groups corresponding to the different defect characteristics in relation to the optimal population parameter data for each of the plurality of data groups; and
   controlling at least one of the one or more external computing devices to, based on the Weibull distribution, generate a comparative visualization of probability distributions of defect times for the defect characteristics identified in the plurality of wafers for each of the plurality of data groups corresponding to the different defect characteristics.

2. The method of claim 1, wherein the setting of the data number set for the plurality of data groups includes setting a data number set different from a previously set data number set.

3. The method of claim 1, wherein the designating of the defect times across the plurality of data groups includes setting a first data group among the plurality of data groups as an extrinsic defect group, setting a second data group among the plurality of data groups as an intrinsic defect group, and setting a third data group among the plurality of data groups as a robust intrinsic defect group according to an order of occurrence for defect times; and
   the outputting of the Weibull distribution for each of the plurality of data groups in relation to the optimal population parameter data for each of the plurality of data groups includes outputting a first Weibull distribution for the first data group in relation to defect times included in the first data group, outputting a second Weibull distribution for the second data group in relation to defect times included in the second data group, and outputting a third Weibull distribution for the third data group in relation to defect times included in the third data group.

4. The method of claim 1, further comprising:
   calculating the likelihood summation by summing likelihoods respectively corresponding to the plurality of data groups, wherein the calculating of the likelihood summation comprises:
     calculating shape information and scale information for each of the plurality of data groups in relation to defect times included in each of the plurality of data groups; and
     calculating a likelihood corresponding to each of the plurality of data groups in accordance with the shape information and the scale information.

5. The method of claim 4, wherein the calculating of the likelihood corresponding to each of the plurality of data groups includes calculating the likelihood using, as a weighting, a ratio of a number of defect times included in each of the plurality of data groups to a total number of defect times.

6. The method of claim 1, wherein the determining of whether the likelihood summation replaces the maximum likelihood summation includes storing, as the maximum likelihood summation, a greatest likelihood summation among likelihood summations corresponding to previous data number sets.

7. The method of claim 1, wherein the determining of whether the likelihood summation replaces the maximum likelihood summation comprises:
   comparing the likelihood summation to the maximum likelihood summation; and
   replacing maximum likelihood summation with the likelihood summation, as a new maximum likelihood summation, when the likelihood summation is greater than the maximum likelihood summation.

8. The method of claim 7, further comprising:
calculating the likelihood summation by summing likelihoods respectively corresponding to the plurality of data groups, wherein the determining of whether the likelihood summation replaces the maximum likelihood summation comprises:
calculating the likelihood summation based on a new data number set for the plurality of data groups; and
determining whether to update the maximum likelihood summation in relation to a likelihood summation based on the new data number set for the plurality of data groups.

9. The method of claim 8, wherein the determining of whether to update the maximum likelihood summation includes ending an update of the maximum likelihood summation when an update determination end condition is satisfied, and
the update determination end condition is satisfied if a cumulative number of update determinations is greater than or equal to a pre-designated threshold, or if the maximum likelihood summation is not replaced by a newly calculated likelihood summation during a pre-designated number of update determinations.

10. The method of claim 1, wherein the determining of the optimal population parameter data for each of the plurality of data groups in relation to the maximum likelihood summation includes determining shape information, scale information, and a weighting for each one of the plurality of data groups.

11. A method for identifying defects on a plurality of semiconductor devices, the method comprising:
performing, using at least one of one or more external computing devices, a quality evaluation process by selectively applying at least one of a test voltage or a test current to each of a plurality of wafers;
generating, using the at least one of one or more external computing devices, defect information data of defect characteristics identified in the plurality of wafers on which the quality evaluation process is performed;
establishing, using a communication interface of a distribution output device, data communication with the at least one of the one or more external computing devices;
receiving, using the communication interface and from the at least one of the one or more external computing devices, the defect information data of defect characteristics identified in the plurality of wafers, the defect information data including defect times associated with the defect characteristics;
generating, using at least one processor of the distribution output device, data number sets for data groups corresponding to different defect characteristics among the defect characteristics, each of the data number sets comprising a specified number of defect times for each of the data groups;
grouping, using the at least one processor of the distribution output device, the defect times according to an order in which corresponding defect characteristics occurred in relation to each of the data number sets;
identifying, using the at least one processor of the distribution output device, a maximum likelihood summation among likelihood summations respectively corresponding to the data number sets in relation to defect times grouped in accordance with the data number sets;
determining, using the at least one processor of the distribution output device, optimal population parameter data for each of the data groups in relation to the maximum likelihood summation; and
transmitting, using the communication interface and to at least one of the one or more external computing devices, a Weibull distribution for each of the data groups corresponding to the different defect characteristics in relation to the optimal population parameter data for each of the data groups, and
controlling at least one of the one or more external computing devices to, based on the Weibull distribution, generate a comparative visualization of probability distributions of defect times for the defect characteristics identified in the plurality of wafers for each of the data groups corresponding to the different defect characteristics.

12. The method of claim 11, wherein the grouping of the defect times includes designating defect times to an extrinsic defect group among the data groups, an intrinsic defect group among the data groups, and a robust intrinsic defect group among the data groups according to an order of occurrence for the defect times; and
the outputting of the Weibull distribution for each of the data groups in relation to the optimal population parameter data for each of the data groups includes outputting a first Weibull distribution for the extrinsic defect group, outputting a second Weibull distribution for the intrinsic defect group, and outputting a third Weibull distribution for the robust intrinsic defect group.

13. The method of claim 11, further comprising:
calculating the likelihood summations respectively corresponding to the data number sets in relation to defect times grouped in accordance with the data number sets, wherein the calculating of the likelihood summations respectively corresponding to the data number sets in relation to defect times grouped in accordance with the data number sets comprises:
calculating shape information and scale information for each of the data groups in relation to defect times included in each of the data groups; and
calculating a likelihood corresponding to each of the data groups in accordance with the shape information and the scale information.

14. The method of claim 13, wherein the calculating of the likelihood corresponding to each of the data groups in accordance with the shape information and the scale information includes calculating the likelihood using, as a weighting, a ratio of a number of defect times included in each of the data groups to a total number of defect times.

15. A device for outputting a data distribution, the device comprising:
a communication interface configured to establish data communication with at least one of one or more external computing devices configured to perform a quality evaluation process by selectively applying at least one of a test voltage or a test current to each of a plurality of wafers and generate defect information data of defect characteristics identified in the plurality of wafer on which the quality evaluation process is performed;
at least one processor configured to implement a calculation unit, a population parameter determining unit, and a distribution outputting unit,
the calculation unit configured to:
receive, using the communication interface and from the at least one of the one or more external computing devices, the defect information data of defect characteristics identified in the plurality of wafers, the defect information data including defect times associated with the defect characteristics, generate a data number set for data groups respectively classified according to an order of occurrence for the defect times and corresponding to different defect characteristics among the defect characteristics, the data number set comprising a specified number of defect times for each of the data groups, designate the defect times across the data groups based on the data number set, and determine whether a likelihood summation based on summing likelihoods respectively corresponding to the data groups replaces a maximum likelihood summation;

the population parameter determining unit configured to determine optimal population parameter data for each of the data groups in relation to the maximum likelihood summation;

the distribution outputting unit configured to transmit, using the communication interface and to at least one of the one or more external computing devices, a Weibull distribution of each of the data groups in relation to the optimal population parameter data for each data group corresponding to the different defect characteristics, wherein at least one of the one or more external computing devices is configured to generate, based on the Weibull distribution, a comparative visualization of probability distributions of defect times for the defect characteristics identified in the wafers for each of the data groups corresponding to the different defect characteristics; and a memory configured to store, as stored information, at least one of the defect times, the likelihood summations, and the maximum likelihood summation and further configured to provide the stored information in response to a request from at least one of the calculation unit, the population parameter determining unit, or the distribution outputting unit.

16. The device of claim 15, wherein the calculation unit is further configured to set a data number set for the data groups as a set different from a previously set data number set.

17. The device of claim 15, wherein the calculation unit is further configured to calculate the likelihood summation by summing the likelihoods respectively corresponding to the data groups, calculate shape information and scale information corresponding to each of the data groups in relation to defect times included in each of the data groups, and calculate a likelihood corresponding to each of the data groups in relation to the shape information and the scale information.

18. The device of claim 17, wherein the calculation unit is further configured to calculate the likelihood using, as a weighting, a ratio of a number of defect times included in each of the data groups to a total number of defect times.

19. The device of claim 15, wherein the calculation unit is further configured to compare the likelihood summation to the maximum likelihood summation and replace the maximum likelihood summation with the likelihood summation as a new maximum likelihood summation when the likelihood summation is greater than the maximum likelihood summation.

20. The device of claim 19, wherein the calculation unit is further configured to calculate the likelihood summation by summing the likelihoods respectively corresponding to the data groups, calculate the likelihood summation based on a new data number set for the data groups, and determine whether to update the maximum likelihood summation in response to the likelihood summation based on the new data number set for the data groups.

* * * * *